(12) United States Patent  
Dzengeleski (10) Patent No.: US 7,498,590 B2  
(45) Date of Patent: Mar. 3, 2009

(54) SCAN PATTERN FOR AN ION IMPLANTER

(75) Inventor: Joseph P. Dzengeleski, Newton, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 414 days.

(21) Appl. No.: 11/473,860

(22) Filed: Jun. 23, 2006

(65) Prior Publication Data

US 2008/0073575 A1    Mar. 27, 2008

(51) Int. Cl.
*H01J 37/317* (2006.01)
*H01J 37/256* (2006.01)
*H01J 37/28* (2006.01)

(52) U.S. Cl. .................. 250/492.21; 250/492.22; 250/492.2; 250/492.3; 250/491.1; 250/397

(58) Field of Classification Search ........... 250/492.21, 250/492.22, 492.2, 492.3, 491.1, 397

See application file for complete search history.

(56) References Cited

U.S. PATENT DOCUMENTS

| 4,449,051 | A | | 5/1984 | Berkowitz | |
|---|---|---|---|---|---|
| 5,132,544 | A | * | 7/1992 | Glavish | 250/492.2 |
| 2006/0076510 | A1 | * | 4/2006 | Chang et al. | 250/492.21 |
| 2008/0078955 | A1 | * | 4/2008 | Graf et al. | 250/492.21 |

FOREIGN PATENT DOCUMENTS

| EP | 0431757 A2 | 6/1991 |
|---|---|---|
| EP | 1306879 A2 | 5/2003 |

* cited by examiner

*Primary Examiner*—Nikita Wells (57) ABSTRACT

An ion implanter includes an ion beam generator configured to generate an ion beam and direct the ion beam towards a workpiece, wherein relative motion between the ion beam and the workpiece produces a scan pattern on a front surface of said workpiece. The scan pattern has an oscillating pattern on at least a portion of said front surface of said workpiece.

18 Claims, 6 Drawing Sheets

SCAN PATTERN FOR AN ION IMPLANTER

FIELD

This disclosure relates to ion implantation and, more particularly, to a scan pattern for an ion implanter.

BACKGROUND

Ion implantation is a standard technique for introducing conductivity-altering impurities into a workpiece such as a semiconductor wafer. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity. The ion beam may be distributed over the wafer area in a scan pattern defined by only beam scanning, by only wafer movement, or by a combination of beam scanning and wafer movement.

Introducing the ions at a specified depth and density into the wafers, which may be a uniform depth and density, is important to ensure that the semiconductor device being formed operates within specification. One factor that can affect the uniformity of the dose into the wafer is the ion beam current. However, the ion beam current can have unexpected instantaneous fluctuations both greater than and less than a desired beam current that may adversely affect uniformity requirements. The magnitude and duration of such fluctuations may sometimes be referred to as the "ion beam noise" of the ion beam.

One effective method of addressing ion beam noise is to achieve a target dose by a plurality of incremental applications of smaller dose levels that sum to the target dose to "average out" the ion beam noise for each location on the front surface of the wafer. Therefore, any fluctuations in ion beam current attributable to each of the plurality of incremental applications of smaller dose levels tend to offset each other. For example, the sum of fluctuations in ion beam current greater than the desired beam current tends to offset the total fluctuations in ion beam current less than the desired beam current for a particular location on the front surface of the wafer. Therefore, the sum of the smaller dose levels for each of the plurality of incremental applications can closely approximate the desired target dose. In general, the effectiveness of this method improves as the plurality of incremental applications increases for each location on the front surface of the wafer.

Differing conventional methods exist to increase the plurality of incremental applications or "touches" of the ion beam to the front surface of the wafer. For example, for an ion beam distributed over the front surface of the wafer by a combination of beam scanning and wafer movement, some conventional methods include increasing the number of passes of the wafer by the scanned ion beam, slowing the speed at which the wafer is moved by the scanned ion beam, and increasing the frequency of the scanned ion beam. While all effective, these conventional methods may be optimized for given throughput and other system requirements. Therefore, some recipes may have to place tighter restraints on the level of permissible ion beam noise allowed during set-up of the ion implanter. This could result in longer set-up times and lower throughput.

A conventional scan pattern, for example developed by the relative motion of a scanned ion beam and the speed at which the wafer is moved by the scanned ion beam in one instance, has a constant relative motion direction between the ion beam and the wafer while the ion beam is incident on the wafer. Only when the beam has traveled beyond an edge of the wafer, does the relative motion reverse direction. This process continues until the ion beam is distributed across the desired front surface area of the wafer. Therefore, once other conventional methods to increase the number of incremental applications or "touches" of the ion beam to the front surface of the wafer are optimized, this conventional scan pattern does not provide an additional way to further increase the number of incremental applications to the wafer to lessen the impact of ion beam noise.

Accordingly, there is a need in the art for a new and improved apparatus and method of providing a new scan pattern on the front surface of a workpiece to lessen the impact of ion beam noise in ion implantation.

SUMMARY

According to a first aspect of the invention, an ion implanter is provided. The ion implanter includes an ion beam generator configured to generate an ion beam, and a scanner. The scanner is configured to oscillate the ion beam when the ion beam is incident on at least a portion of a front surface of a workpiece.

According to another aspect of the invention, a method is provided. The method includes generating an ion beam, and oscillating the ion beam when the ion beam is incident on at least a portion of a front surface of a workpiece.

According to yet another aspect of the invention, another ion implanter is provided. The ion implanter includes an ion beam generator configured to generate an ion beam and direct the ion beam towards a workpiece, wherein relative motion between the ion beam and the workpiece produces a scan pattern on a front surface of said workpiece. The scan pattern has an oscillating pattern on at least a portion of said front surface of said workpiece.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
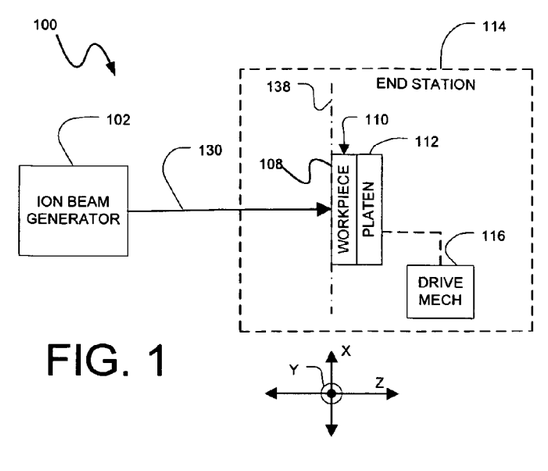
FIG. 1 is a schematic block diagram of an ion implanter.

FIG. 1 illustrates a block diagram of an ion implanter 100 including an ion beam generator 102 and an end station 114. The ion beam generator 102 can include various types of components and systems to generate an ion beam 130 having desired characteristics. The ion beam 130 may be a spot beam and the spot beam may have a cross-sectional shape depending on, at least, the energy of the ion beam 130. The ion beam 130 may also be a ribbon beam having a large width to height ratio. The ion beam 130 generated by the ion beam generator 102 can be any type of charged particle beam.

The end station 114 may have a platen 112 to support one or more workpieces 110 in the path of the ion beam 130 such that ions of the desired species are implanted into the workpiece 110. In one embodiment, the workpiece 110 may be a semiconductor wafer and may be referred to as such herein. The semiconductor wafer may be fabricated from any type of semiconductor material such as silicon or any other material that is to be implanted using the ion beam 130. The wafer can take various physical shapes such as a common disk shape.

The end station 114 may include a workpiece drive system (not illustrated) to physically move the workpiece 110 to and from the platen 112 from holding areas. The workpiece 110 may be clamped to the platen 112 using known techniques such as electrostatic clamping. The end station 114 may also include a drive mechanism 116 to drive the platen 112 and hence the workpiece 110 clamped to the platen 112 in a desired way. For example, the drive mechanism 116 may include servo drive motors, screw drive mechanisms, mechanical linkages, and any other components as are known in the art to provide the desired mechanical translation.

The ion beam 130 may be distributed over the front surface 108 of the workpiece 110 in a scan pattern defined by only beam scanning, by only workpiece movement, or by a combination of beam scanning and workpiece movement. To assist with explanation, a coordinate system is defined with reference to the workpiece plane 138 defined by the workpiece 110 in its implant position. The coordinate system has an origin at the center of the workpiece 110 positioned for ion implantation in the workpiece plane 138. The X axis is horizontal and in the workpiece plane 138, the Y axis is vertical and in the workpiece plane 138, and the Z axis is perpendicular to the workpiece plane 138 in the direction of travel of the ion beam 130. For clarity of illustration, the origin of the X, Y, Z coordinate system of FIG. 1 is positioned in the −X direction away from the above defined origin.

In one instance, the ion beam 130 may be distributed over the front surface 108 of the workpiece 110 in a scan pattern defined by beam scanning only as a scanner (not illustrated in FIG. 1) scans the ion beam in both the X direction and the Y direction while the workpiece 110 is fixed in an implant position. In another instance, the scan pattern may be defined by a combination of beam scanning and workpiece movement. In this instance, the ion beam 130 may be scanned in a first plane by a scanner as the workpiece 110 is driven in a second plane orthogonal to the first plane. In one example, the ion beam 130 is scanned in a horizontal plane parallel to a plane defined by the X and Z axes, while the workpiece 110 is driven in a vertical plane defined by the X and Y axes. In yet another instance, the scan pattern on the front surface 108 of the workpiece 110 may be defined by workpiece movement only as the ion beam 130 remains stationary and the workpiece 110 is driven in the X and Y directions by the drive mechanism 116.

Figure 2:
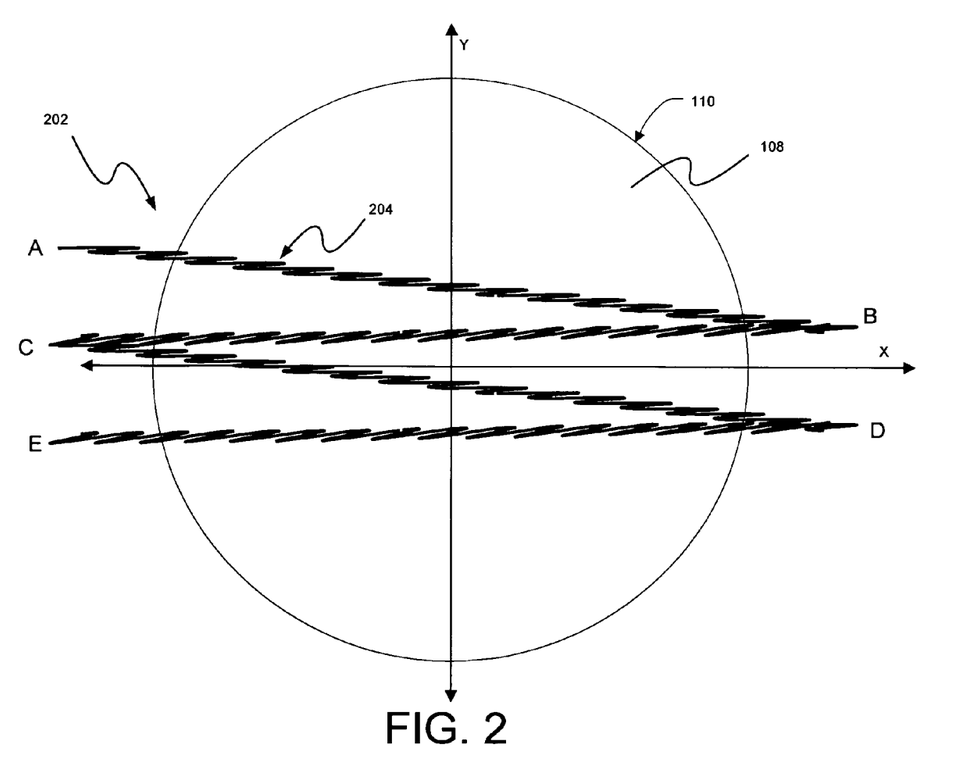
FIG. 2 is a schematic representation of a scan pattern on the front surface of the workpiece of FIG. 1.

Turning to FIG. 2, a schematic representation of a scan pattern 202 on the front surface 108 of the workpiece 110 viewed in a downstream Z direction is illustrated. As used herein, "downstream" and "upstream" and are referenced in the direction of ion beam transport. The scan pattern 202 is delineated by reference designators A-E. Each of these designators A-E refers to a region of the scan pattern 202 where the ion beam 130 changes direction with respect to the workpiece when the ion beam 130 is not incident on the front surface 108 of the workpiece 110. The reference designators A-E may generally form a modified zig-zag shape that may be referred to as a modified "W" scan. Only one modified "W" scan expanded substantially in the Y direction is illustrated for clarity of illustration. Those skilled in the art will recognize that a large plurality of modified "W" scans may take place during one pass of the ion beam 130 relative to the front surface 108 of the workpiece 110. In one embodiment, one modified "W" scan may cross the workpiece four times (from reference designator A-B, B-C, C-D, and D-E) for each 0.635 millimeter (mm) increment in the Y direction.

The scan pattern 202 advantageously has an oscillating pattern 204 on at least a portion of the front surface 108 of the workpiece 110. For instance, as the ion beam 130 is moved relative to the workpiece 110 between reference designators A and B, the oscillating pattern 204 moves back and forth so that the direction of relative motion between the ion beam 130 and the workpiece 110 is not constant between reference designators A and B. The oscillating pattern 204 may have a variety of periodic shapes including, but not limited to, the sinusoidal shape of FIG. 2. The oscillating pattern 204 may be created by relative motion between the ion beam 130 and the workpiece 110. This relative motion may be due to beam scanning only, workpiece movement only, or a combination of beam scanning and workpiece movement. The oscillating pattern can be synchronous or asynchronous with the scan pattern.

Figure 3:
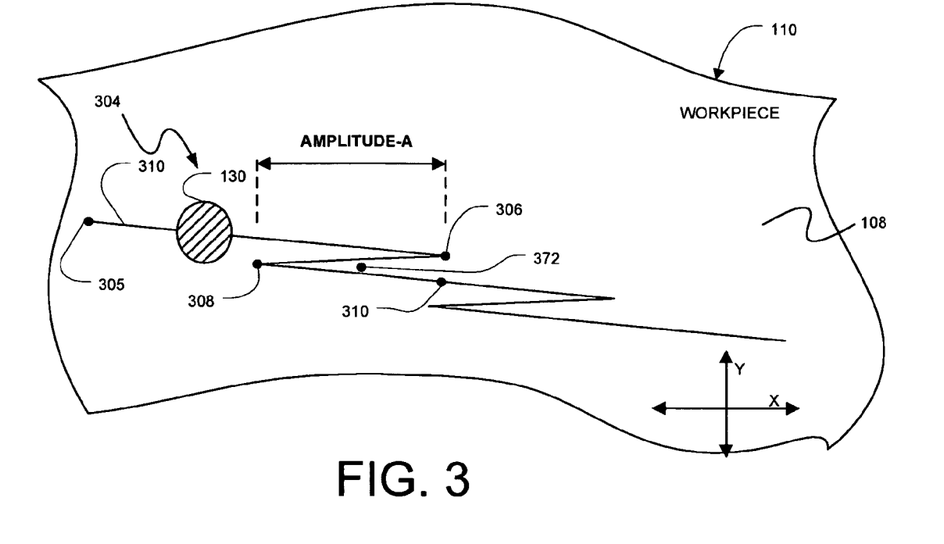
FIG. 3 is a magnified view of an oscillating pattern of a scan pattern on a front surface of a workpiece.

Turning to FIG. 3, a magnified view of an oscillating pattern 304 of one scan pattern consistent with an embodiment of the invention is illustrated. The oscillating pattern 304 is provided on at least a portion of the front surface 108 of the workpiece 110. The oscillating pattern 304 may reverse directions back and forth at differing points, e.g., points 306, 308, along the oscillating pattern 304. The oscillating pattern 304 may be defined by characteristics such as amplitude and frequency. The amplitude may be defined by a length of a reversal in the direction of the ion beam relative to the workpiece, e.g., the length A in the X direction between points 306 and 308. The frequency may be defined by the number of oscillations back and forth per second, e.g., one cycle may be the time it takes the ion beam to move between points 306 and 310.

If the ion beam 130 is a spot beam having a known cross sectional area (which may become increasingly larger at low beam energies due to space charge effects) when it strikes the front surface 108 of the workpiece 110, the frequency and amplitude of the oscillations of the oscillating pattern 304 can be modified to increase the number of times a particular portion of the front surface of the workpiece is "touched" by the ion beam 130. For example, the portion 372 of the front surface 108 of the workpiece 110 may be "touched" three times by the spot beam 130 as it moves relative to the workpiece between points 305 and 306, between points 306 and 308, and between points 308 and 310. Accordingly, the number of "touches" of portion 372 is increased by a factor of 3 in this example compared to a conventional "W" scan pattern with a constant direction of relative motion between the ion beam and the workpiece across a similar dimension of the workpiece.

Figure 4:
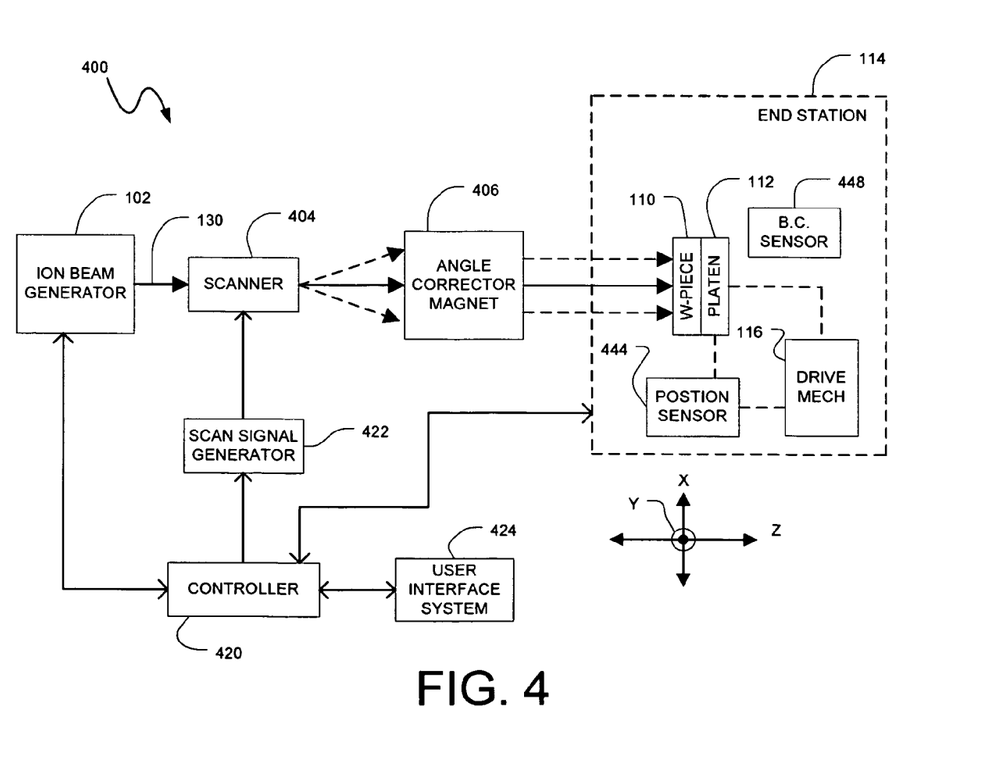
FIG. 4 is a schematic block diagram of another ion implanter having a scanner.

Turning to FIG. 4, another embodiment of an ion implanter 400 consistent with the invention is illustrated. Components of FIG. 4 similar to components of FIG. 1 are similarly labeled and hence any repetitive description is omitted herein for clarity. The ion implanter 400 may include a scanner 404, a scan signal generator 422, an angle corrector magnet 406, a controller 420, and a user interface system 424. The end station 114 may also include a beam current sensor 448 and a position sensor 444. The beam current sensor 448 may provide a signal representative of the ion beam current of the ion beam 130. The signal from the beam current sensor 448 may be provided to the controller 420. The beam current sensor 448 may be positioned downstream from the workpiece plane 138 as illustrated, but may also be positioned upstream from the workpiece plane. In one embodiment, the beam current sensor 448 may be a Faraday sensor as is known in the art. The position sensor 444 may provide a sensor signal representative of the position of the workpiece 110 relative to the ion beam 130. Although illustrated as a separate component, the position sensor 444 may be part of other systems such as the drive mechanism 116 and the position sensor may be any type of position sensor known in the art such as a position-encoding device. The position signal from the position sensor 444 may also be provided to the controller 420.

The scanner 404 may be an electrostatic scanner or a magnetic scanner. An electrostatic scanner may include at least one scan electrode positioned proximate the ion beam. Other electrostatic scanners may have one or more sets of scan electrodes in that may be spaced apart to define a gap through which the ion beam is directed. The ion beam may be deflected by an electric field proximate the scan electrode. The electric field may be produced in response to a voltage signal provided by the scan signal generator 422 to at least one scan electrode of the electrostatic scanner. A magnetic scanner may include magnetic polepieces and a coil that constitute an electromagnet. The magnetic polepieces may be spaced apart to define a gap. The ion beam 130 may be directed through the gap and may be deflected by a magnetic field in the gap. The magnetic field may be produced in response to a current scan signal provided by the scan signal generator 422 to the coil of the magnetic scanner.

The scan signal generator 422 may provide scan signals. In the case of an electrostatic scanner, the scan signal may be a voltage signal. In the case of a magnetic scanner, the scan signal may be a current signal. Such signals may also be amplified by associated amplifiers. The controller 420 may control the scan signal provided by the scan signal generator 422.

The angle corrector magnet 406 may deflect ions of the desired ion species of the ion beam 130 to convert diverging ion beam paths from the scanner 404 to nearly collimated ion beam paths having substantially parallel ion path trajectories.

The controller 420 may receive input data and instructions from any variety of systems and components of the ion implanter 400 and provide output signals to control the components of the ion implanter 400 such as the scanner 404. For clarity of illustration, the controller 420 is illustrated as providing output signals to the ion beam generator 102, the scan signal generator 422, and the end station 114 Those skilled in the art will recognize that the controller 420 may provide output signals to each component of the ion implanter 400 and receive input signals from the same. The controller 420 can be or include a general-purpose computer or network of general-purpose computers that may be programmed to perform desired input/output functions. The controller 420 can also include other electronic circuitry or components, such as application specific integrated circuits, other hardwired or programmable electronic devices, discrete element circuits, etc. The controller 420 may also include communication devices, data storage devices, and software.

A user interface system 424 may include, but not be limited to, devices such as touch screens, keyboards, user pointing devices, displays, printers, etc. to allow a user to input commands and/or data and/or to monitor the ion implanter 400 via the controller 420. Desired recipes including, but not limited to, beam energy, beam current, ion species, etc. of an implant may be input by a user via the user interface system 424.

In operation, the ion beam generator 102 is configured to generate an ion beam 130, and the scanner 404 is configured to deflect or scan the ion beam 130 in at least one plane. The scanner 404 is also configured to oscillate the ion beam 130 when the ion beam is incident on at least a portion of the front surface of the workpiece 110 by deflecting the ion beam in an oscillating pattern as the ion beam is scanned across a dimension of the workpiece 110. In the embodiment of FIG. 4, the scanner may scan the ion beam in a horizontal plane parallel to a plane defined by the X and Z axes, while the workpiece 110 is driven by the drive mechanism 116 in a vertical plane defined by the X and Y axes to distribute the ion beam over an area of the workpiece 110. The oscillation of the ion beam 130 by the scanner 404 in this instance may provide an oscillating pattern as illustrated in at least FIGS. 2 and 3.

Figure 5:
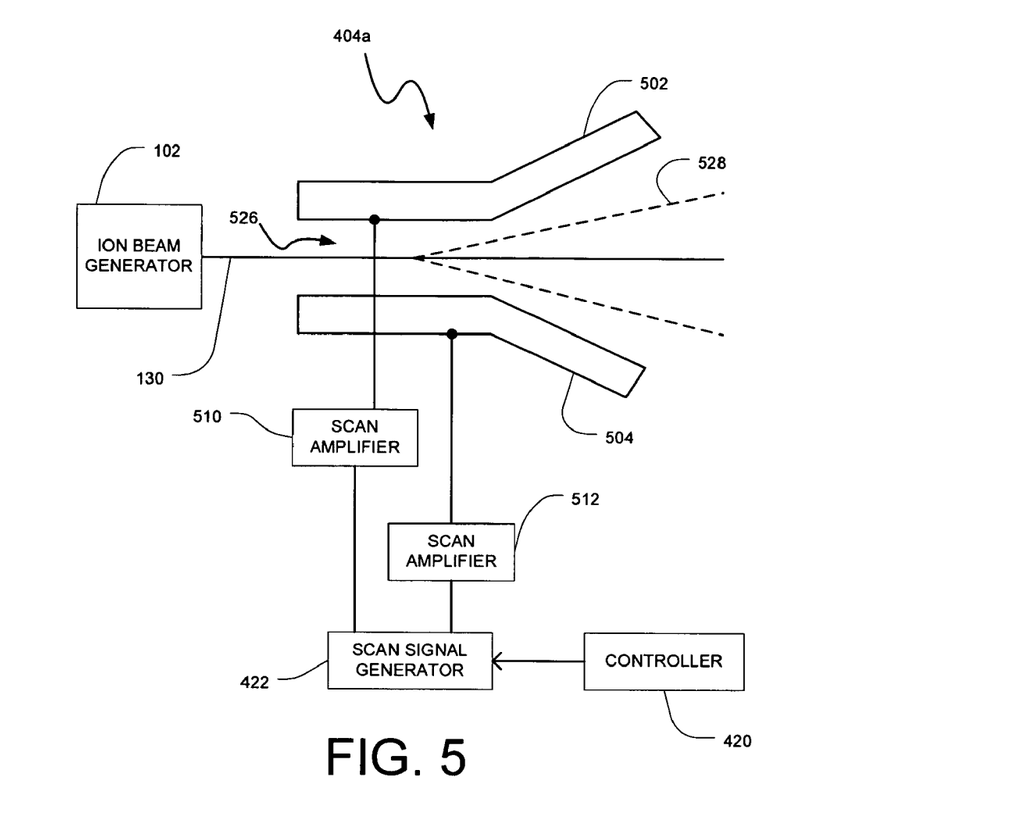
FIG. 5 is a schematic diagram of an electrostatic scanner that may be utilized as the scanner of FIG. 4.

Turning to FIG. 5, one embodiment of an electrostatic scanner 404a that may be utilized as the scanner 404 of FIG. 4 is illustrated. The electrostatic scanner 404a of this embodiment may have a set of scan electrodes in the form of scan plates 502, 504 positioned on opposite sides of the ion beam 130. Other electrostatic scanners may not have a set of scan electrodes, but may only have one scan electrode positioned proximate the ion beam 130. Additional electrodes (not illustrated in FIG. 4) such as a prescan electrode positioned upstream of the scan plates 502, 504 and a postscan electrode positioned downstream of the scan plates 502, 504 may also be present.

The scan plates 502, 504 may be spaced apart to define a gap 526. The ion beam 130 may be directed through the gap 526 and a fan-shaped beam envelope 528 of the ion beam 130 may increase in width as it passes through the gap 526. Scan plate 502 may be connected to scan amplifier 510 and scan plate 504 may be connected to scan amplifier 512. Scan amplifiers 510, 512 may each receive a voltage signal from the scan signal generator 422 to control the deflection of the ion beam 130. The scan signal generator 422 may be controlled by the controller 420.

Figure 6:
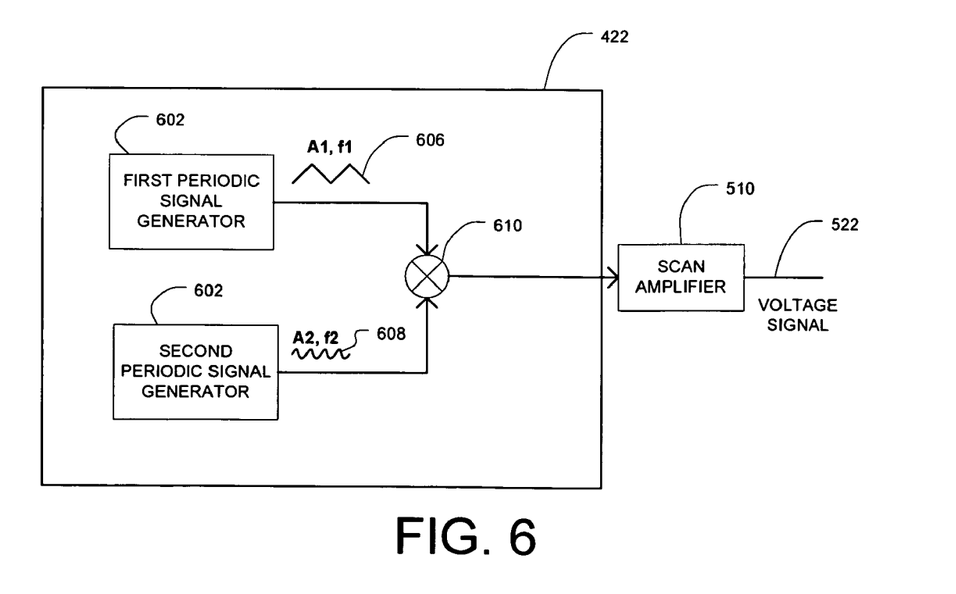
FIG. 6 is a block diagram of one embodiment of the scan signal generator of FIG. 5.

Turning to FIG. 6, a block diagram of one embodiment of the scan signal generator 422 of FIG. 5 is illustrated to provide a voltage signal to each scan plate 502, 504. In response to the voltage signals, the electrostatic scanner 404a oscillates the ion beam 130 when the ion beam is incident on at least a portion of the front surface of the workpiece 110 by deflecting the ion beam back and forth as the ion beam is scanned across a dimension of the workpiece 110.

The scan signal generator may include a first periodic signal generator 602 and a second periodic signal generator 604. The first periodic signal generator 602 may generate a first periodic signal 606 having a first amplitude (A1) and a first frequency (f1). The second periodic signal generator 604 may generate a second periodic signal 608 having second amplitude (A2) and a second frequency (f2). The periodic signals may have any shape and in the embodiment of FIG. 6, the first periodic signal 606 may have a saw-tooth shape while the second periodic signal 608 may have a sine wave shape. A summation circuit 610 may sum the first and second periodic signals 606, 608 and output the combined voltage signal to a respective scan amplifier, e.g., scan amplifier 510, which further amplifies the voltage signal and provides it to a respective scan plate.

Figure 7:
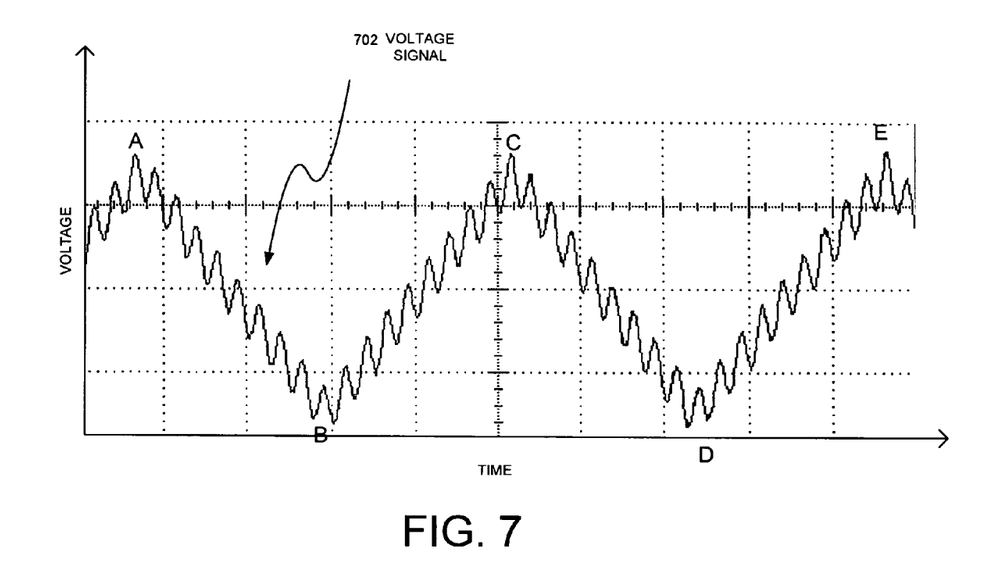
FIG. 7 is a plot of a voltage signal input to one scan electrode of the electrostatic scanner of FIG. 5.

FIG. 7 illustrates a plot of an exemplary voltage signal 702 that may be provided to the scan plate 502. A similarly developed voltage signal 180 degrees out of phase with the voltage signal of FIG. 7 may be provided to the other scan plate 504 so that as one plate "pulls" the ion beam in one direction the opposing plate "pushes" the ion beam in the same direction. The voltage signal 702 may also be provided to one scan electrode of an electrostatic scanner having only one scan electrode.

The voltage signal 702 has a first periodic component having a saw-tooth shape and a second periodic component having a sine wave shape added thereto. The saw-tooth signal may have a peak-to-peak amplitude greater than the peak-to-peak amplitude of sine wave signal. The saw-tooth signal may also have a frequency less than the sine wave signal. In one embodiment, the peak-to-peak amplitude of the saw-tooth signal may be about 10 volts while the peak-to-peak amplitude of the sine wave signal may be 1 volt. In this embodiment, the frequency of the saw-tooth signal may be 1 kiloHertz (kHz) while the frequency of the sine wave signal may be 10 kHz. The frequency of the second periodic signal such as the sine wave signal may be selected to be high enough so that it is transparent to the controller 420.

The plot of the voltage signal 702 is also labeled with reference designators A-E that correspond to the reference designators A-E of the oscillating scan pattern 202 detailed in FIG. 2. The oscillating pattern 204 of the scan pattern 202 is thus dependent on the second periodic component, e.g., the sine wave signal in this embodiment.

The scanner 404 may be configured to adjust a characteristic of the oscillation of the ion beam 130 incident on at least a portion of a front surface 108 of the workpiece 110 in response to differing parameters. One parameter may be a position of the ion beam relative to the front surface of the workpiece 110.

Figure 8:
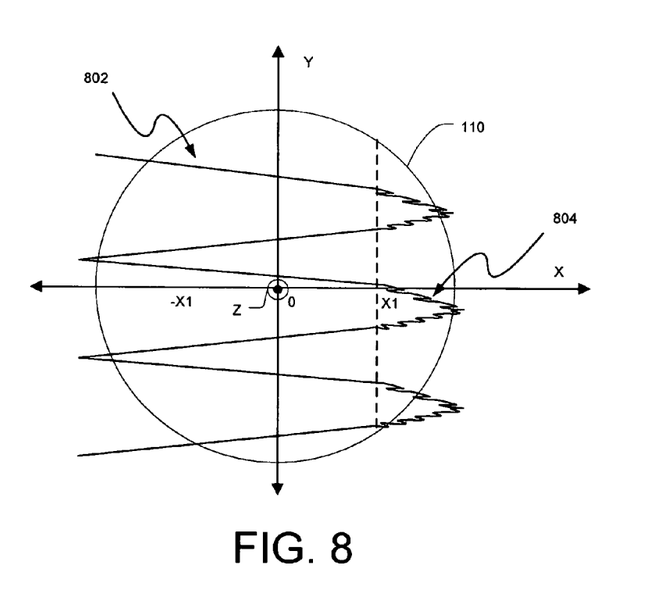
FIG. 8 is a schematic representation of another scan pattern on a front surface of a workpiece varying in response to a position of the ion beam relative to the front surface of the workpiece.

Turning to FIG. 8, a schematic representation of another scan pattern 802 on a front surface of a workpiece 110 varying in response to a position of the ion beam on the front surface of the workpiece is illustrated. The scan pattern 802 is configured to oscillate for X positions greater than X1 corresponding to any Y value. In one example, the scan pattern 802 may be developed by the scanner 404 scanning the ion beam 130 in a horizontal plane parallel to a plane defined by the X and Z axes, while the workpiece is driven in a vertical plane defined by the X and Y axis. As the scanner 404 scans the ion beam past the +X1 position, the scanner 404 may begin to oscillate the ion beam to define the oscillation pattern 804. As the ion beam is scanned past the +X1 position in the negative X direction, the scanner may stop oscillating the ion beam to produce the scan pattern 802. To provide this scan pattern 802, the controller 420 may receive a signal representative of the position of the ion beam relative to the front surface of the workpiece 110 and may control the scan signal generator 422 in response thereto.

In the embodiment of FIG. 8, the oscillating pattern 804 may be present or not in response to position of the ion beam relative to the workpiece. In other embodiments, the characteristics of the oscillation of the ion beam may be adjusted to differing levels in response to position. For example, the amplitude and frequency of the oscillation may be adjusted to differing levels in response to differing positions of the ion beam relative to the workpiece. The scanner 404 may also be configured to adjust a characteristic of the oscillation of the ion beam 130 incident on at least a portion of a front surface of the workpiece in response to fluctuations in ion beam current of the ion beam 130.

Figure 9:
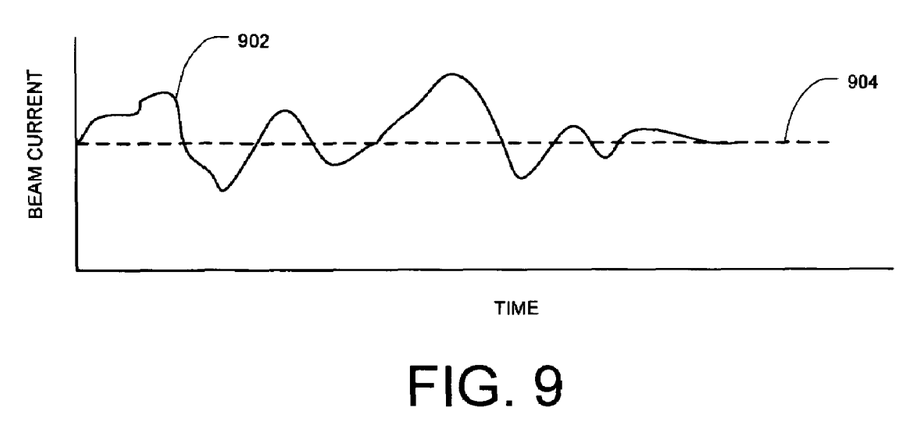
FIG. 9 is a plot of beam current versus time.

Turning to FIG. 9, a plot 902 of ion beam current of the ion beam 130 versus time is illustrated. The magnitude and duration of the fluctuations in the ion beam current may sometimes be referred to as the "ion beam noise" of the ion beam, and in some instances these fluctuations may be as high as +/−30% from a desired beam current 904. The beam current sensor 448 may be a setup Faraday sensor positioned in the end station 114 and it may monitor the beam current. The beam current sensor 448 may provide a signal representative of beam current such as plot 902 to the controller 420. In response, the controller 420 can control the scanner 404 to adjust a characteristic of the oscillation of the ion beam 130. For an ion beam having an ion beam noise above differing thresholds, the scanner 404 may be configured to increase the frequency and/or amplitude of oscillations to increase the number of times that a portion of the workpiece 110 would be "touched" by the ion beam with all other parameters being equal. For a relatively less noisy ion beam having an ion beam noise less than differing thresholds, the scanner 404 may be configured to decrease the frequency and/or amplitude of oscillations and/or even to disable this feature entirely.

The scanner 404 may also be configured to adjust a characteristic of the oscillation of the ion beam 130 incident on at least a portion of a front surface of the workpiece in response to an energy of the ion beam 130. The characteristics of the oscillation of the beam include a frequency and amplitude of the oscillation of the beam. In operation, a user may input a particular recipe via the user interface system 424 specifying a particular type of ion beam 130 having a particular energy level. In response, the controller 420 may control the scanner 404 to provide a desired oscillation of the ion beam when it is incident on the front surface of the workpiece 110. A higher energy ion beam may be highly focused compared to a lower energy ion beam which is more prone to beam "blowup" due to known space charge effects. Accordingly, the frequency and/or amplitude of the oscillating pattern may be increased for the more highly focused ion beam.

Figure 10:
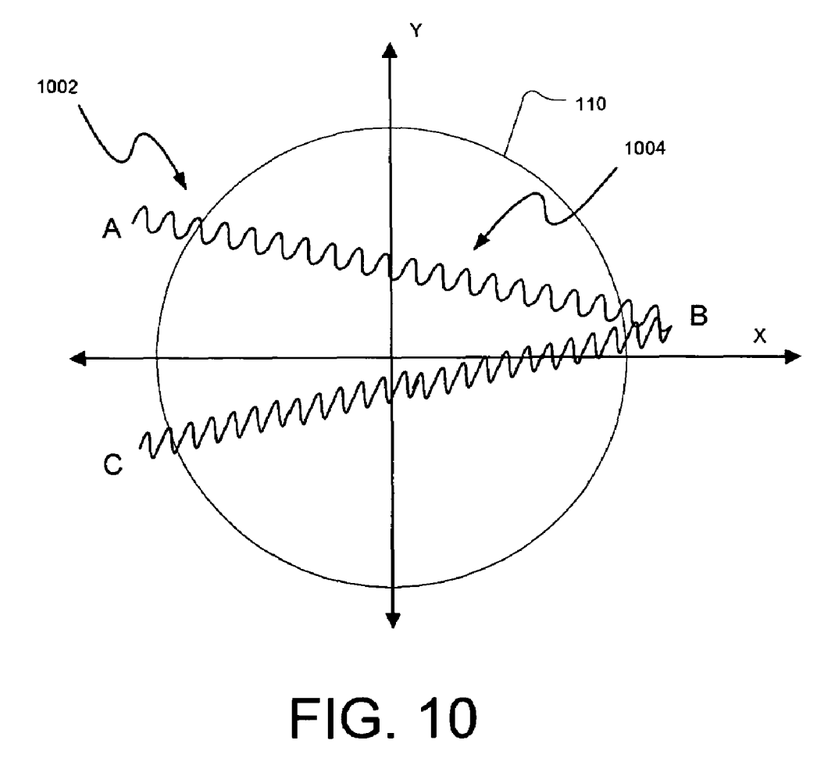
FIG. 10 is a schematic representation of another scan pattern consistent with the present invention.

FIG. 10 illustrates another scan pattern 1002 having an oscillating pattern 1004 consistent with the invention. Compared to prior scan pattern embodiments, the oscillating pattern 1004 may oscillate in a vertical Y direction as the ion beam is moved relative to the workpiece 110 between reference designators A, B, and C. In one embodiment, the scan pattern 1002 may be accomplished with a scanner having two sets of scan plates (horizontal and vertical scan plates) to scan the ion beam in the X and Y directions. As the beam is scanned in the X direction, the workpiece may be driven in the Y direction. The vertical scan plates may receive a voltage signal to oscillate the scanned ion beam in the vertical Y direction to provide the oscillation pattern 1004. For clarity of illustration, the scan pattern 1002 is illustrating as crossing the workpiece only two times although in reality the scan pattern 1002 may cross the workpiece many times, e.g., it may cross the workpiece four times for each 0.635 mm increment in the Y direction in one instance.

Figure 11:
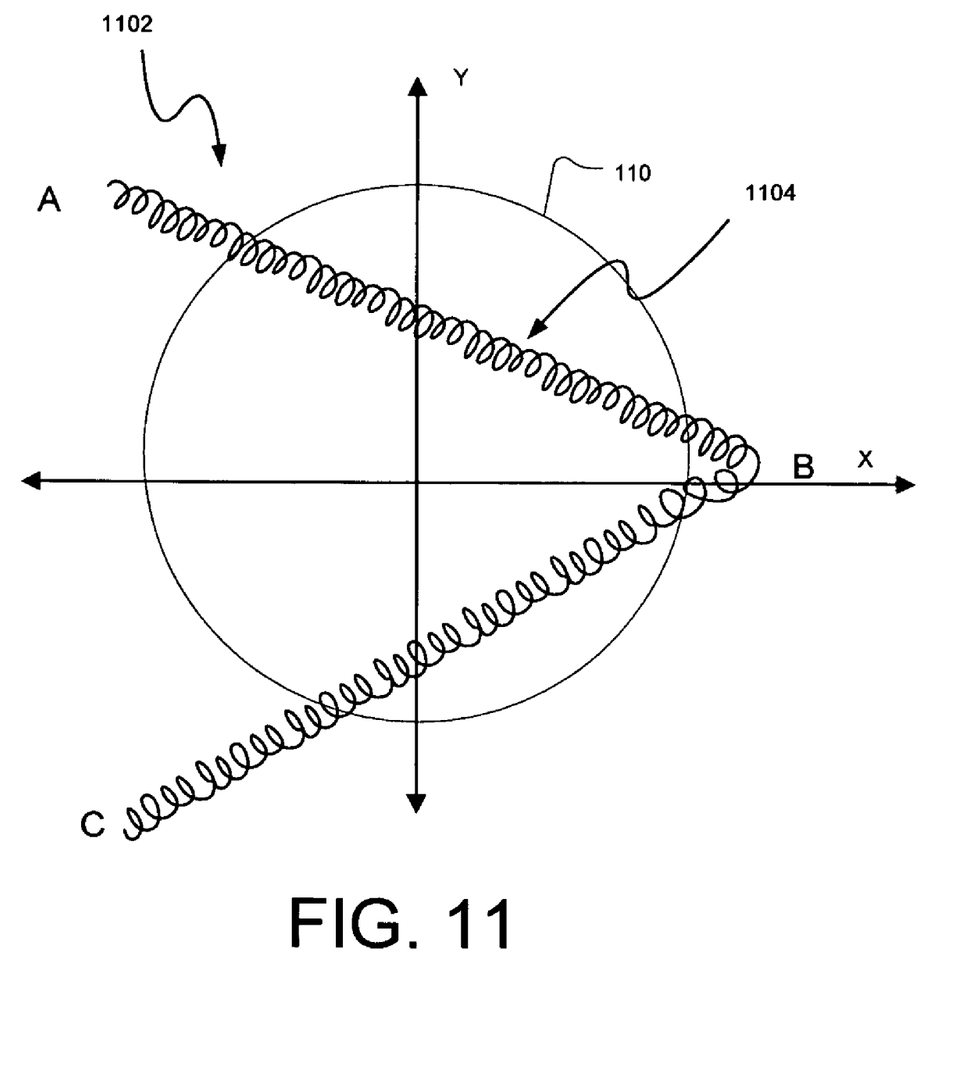
FIG. 11 is a schematic representation of yet another scan pattern consistent with the present invention.

FIG. 11 illustrates yet another scan pattern 1102 having an oscillating pattern 1104 consistent with the invention. Compared to the scan pattern of FIG. 10, the oscillating pattern 1104 may oscillate in both the vertical Y direction and the horizontal X direction as the ion beam is moved relative to the workpiece 110 between reference designators A, B, and C.

For clarity of illustration, the scan pattern 1102 is illustrating as crossing the workpiece only two times although in reality the scan pattern 1102 may cross the workpiece many times, e.g., it may cross the workpiece four times for each 0.635 mm increment in the Y direction in one instance.

Advantageously, there is provided an ion implanter wherein relative motion between the ion beam and the workpiece produces a scan pattern that has an oscillating pattern on at least a portion of said front surface of said workpiece. Hence, the portion of the workpiece may be "touched" more often than a conventional scan pattern with all other parameters being equal. This lessens the detrimental affects of ion beam noise by providing better averaging of ion beam noise. For some applications, this may enable tighter restraints on the level of ion beam noise allowed during ion beam setup to be relaxed. Accordingly, shorter set-up times and higher throughput can be achieved. With all other parameters (including ion beam noise) being equal, the oscillating scan pattern can improve uniformity by increasing the number of times a particular location on the workpiece is "touched" by the ion beam. This is particular true for highly focused spot beams and low-pass implants that move the workpiece past the scanned ion beam a comparatively low number of times.

Furthermore, for similar reasons an oscillation of a scanned ion beam as the ion beam is incident on a beam current sensor can improve the accuracy of the beam current sensor. For example, for a Faraday sensor that produces a current reading in response to a quantity of ions incident on the Faraday sensor, a signal to noise ratio of the current reading is improved with an oscillating scan pattern incident on the Faraday sensor compared to a conventional scan pattern.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting.

What is claimed is:

1. An ion implanter comprising:
   an ion beam generator configured to generate an ion beam; and
   a scanner configured to oscillate said ion beam when said ion beam is incident on at least a portion of a front surface of a workpiece; wherein said scanner is further configured to oscillate said ion beam in response to a position of said ion beam relative to said front surface of said workpiece.

2. The ion implanter of claim 1, wherein said scanner is further configured to adjust a characteristic of said oscillation of said ion beam in response to an energy of said ion beam.

3. The ion implanter of claim 2, wherein said characteristic comprises a frequency or amplitude of said oscillation.

4. The ion implanter of claim 1, wherein said scanner is further configured to adjust a characteristic of said oscillation of said ion beam in response to fluctuations in ion beam current of said ion beam.

5. The ion implanter of claim 1, wherein said scanner comprises an electrostatic scanner.

6. The ion implanter of claim 5, wherein said electrostatic scanner comprises at least one scan electrode positioned proximate said ion beam, wherein said electrostatic scanner is further configured to oscillate said ion beam at a frequency and an amplitude in response to a voltage signal provided to said at least one scan electrode.

7. The ion implanter of claim 1, wherein said scanner is further configured to scan said ion beam in a first plane, and wherein said ion implanter further comprises a drive mechanism configured to drive said workpiece in a second plane orthogonal to said first plane, wherein a scan pattern of said ion beam on said front surface of said workpiece is provided by relative motion of said ion beam to said workpiece as said ion beam is scanned in said first plane and said workpiece is driven in said second plane, said scan pattern having an oscillating pattern on at least said portion of said front surface of said wafer in response to said oscillation of said ion beam.

8. A method comprising:
   generating an ion beam; and
   oscillating said ion beam when said ion beam is incident on at least a portion of a front surface of a workpiece; further comprising adjusting a characteristic of said oscillating of said ion beam in response to a position of said ion beam relative to said front surface of said workpiece.

9. The method of claim 8, further comprising adjusting a characteristic of said oscillating of said ion beam in response to an energy of said ion beam.

10. The method of claim 9, wherein said characteristic comprises a frequency or amplitude of said oscillating of said ion beam.

11. The method of claim 8, further comprising adjusting a characteristic of said oscillating of said ion beam in response to fluctuations in ion beam current of said ion beam.

12. The method of claim 8, wherein said oscillating of said ion beam is at a frequency and amplitude and wherein said method further comprises adjusting said frequency and amplitude.

13. The method of claim 8, further comprising:
   scanning said ion beam in a first plane;
   driving said workpiece in a second plane orthogonal to said first plane, wherein a scan pattern of said ion beam on said front surface of said workpiece is provided by relative motion of said ion beam to said workpiece as said ion beam is scanned in said first plane and said workpiece is driven in said second plane, said scan pattern having an oscillating pattern on at least said portion of said front surface of said wafer in response to said oscillation of said ion beam.

14. An ion implanter comprising:
   an ion beam generator configured to generate an ion beam and direct said ion beam towards a workpiece, wherein relative motion between said ion beam and said workpiece produces a scan pattern on a front surface of said workpiece, said scan pattern having an oscillating pattern on at least a portion of said front surface of said workpiece.

15. The ion implanter of claim 14, further comprising
   a scanner configured to oscillate said ion beam to provide said oscillating pattern of said scan pattern.

16. The ion implanter of claim 15, wherein said scanner comprises an electrostatic scanner having at least one scan electrode positioned proximate said ion beam, wherein said electrostatic scanner is further configured to oscillate said ion beam at a frequency and an amplitude in response to a voltage signal provided to said at least one scan electrode.

17. The ion implanter of claim 16, wherein said voltage signal comprises a first periodic component and a second periodic component, said first periodic component having a first peak-to-peak amplitude and a first frequency and said second periodic component having a second peak-to-peak amplitude and a second frequency, said second peak-to-peak amplitude less than said first peak-to-peak amplitude and said second frequency greater than said first frequency, wherein said oscillating pattern of said scan pattern is dependent on said second periodic component.

18. The ion implanter of claim 17, wherein said first peak-to-peak amplitude is about 10 volts, said first frequency is about 1 kiloHertz (kHz), said second peak-to-peak amplitude is about 1 volts, and said second frequency is about 10 kHZ.

* * * * *